United States Patent [19]

Hong et al.

[11] Patent Number: 5,668,411

[45] Date of Patent: Sep. 16, 1997

[54] DIFFUSION BARRIER TRILAYER FOR MINIMIZING REACTION BETWEEN METALLIZATION LAYERS OF INTEGRATED CIRCUITS

[75] Inventors: Qi-Zhong Hong, Dallas; Shin-Puu Jeng, Plano; Robert H. Havemann, Garland, all of Tex.

[73] Assignee: Texas Instruments Incorporated, Dallas, Tex.

[21] Appl. No.: 685,159

[22] Filed: Jul. 23, 1996

Related U.S. Application Data

[60] Continuation of Ser. No. 474,286, Jun. 7, 1995, abandoned, which is a division of Ser. No. 412,473, Mar. 28, 1995, abandoned.

[51] Int. Cl.$^6$ ............................ H01L 21/44; H01L 29/43
[52] U.S. Cl. ........................ 257/751; 257/915; 438/653
[58] Field of Search ............................ 257/751, 915; 437/190, 195

[56] References Cited

U.S. PATENT DOCUMENTS

| | | | |
|---|---|---|---|
| 5,008,216 | 4/1991 | Huang et al. | 437/192 |
| 5,093,710 | 3/1992 | Higuchi | 357/71 |
| 5,118,385 | 6/1992 | Kumar et al. | 156/644 |
| 5,202,579 | 4/1993 | Fujii et al. | 257/915 |
| 5,231,053 | 7/1993 | Bost et al. | 437/190 |
| 5,240,880 | 8/1993 | Hindman et al. | 437/190 |
| 5,242,860 | 9/1993 | Nulman et al. | 437/190 |
| 5,270,254 | 12/1993 | Chen et al. | 437/190 |
| 5,275,973 | 1/1994 | Gelatos | 437/195 |
| 5,312,772 | 5/1994 | Yokoyama et al. | 437/190 |
| 5,312,775 | 5/1994 | Fujii et al. | 437/192 |
| 5,313,100 | 5/1994 | Ishii et al. | 257/915 |
| 5,345,108 | 9/1994 | Kikkawa | 257/915 |
| 5,420,072 | 5/1995 | Fiordalice et al. | 437/192 |
| 5,434,044 | 7/1995 | Nulman et al. | 437/192 |
| 5,449,641 | 9/1995 | Maeda | 437/195 |
| 5,523,259 | 6/1996 | Merchant et al. | 437/190 |

FOREIGN PATENT DOCUMENTS 0 525 637 A1  2/1993  European Pat. Off. .

OTHER PUBLICATIONS

Kaizuka T. et al. "AL(111)/CVD-TiN(111) Stacked Film Formation Technique with High Aspect-Ratio Contact Hole Filling for Highly Reliable Interconnects", International Conference on Solid State Devices and Materials, Aug. 29, 1993, pp. 555-557.

Hideki Shibata, et al. "The Effects of AL(111) Crystal Orientation on Electromigration in Half-Micron Layered AL Interconnects", Japanese Journal of Applied Physics, Oct. 1, 1993, vol. 32, No. 10, Part 1, pp. 4479-4484.

B. Lee, E.C. Douglas, K. Pourrezaei, and N. Kumar, "Effect of Oxygen on the Diffusion Barrier Properties of TiN", VLSI Multilevel Interconnect Conference (VMIC) Proceedings, pp. 344-350, (1987).

M. Inoue, K. Hashizume, K. Watanabe, and H. Ysuchikawa, "The Properties of Reactive Sputtered TiN Films For VLSI Metallization", VMIC Proceedings, pp. 205-211, (1988).

H. P. Kattelus, J. Tandon, C. Sala, and M. -A. Nicolet, "Bias-induced Stress Transisitions in Sputtered TiN Films", J. Vac. Sci. Technol. A 4, pp. 1850-1854, (1986).

H. Joswig and W. Palmer, "Improved Performance of TiN-Diffusion Barriers After a Post-Treatment", VMIC Proceedings, p. 477, (1990).

W. Sinke, G. Frinjlink, and F. Saris, "Oxygen in Titanium Nitride Diffusion Barriers", Appl. Phys. Lett. 47, pp. 471-473, (1985).

T. Kikkawa, H. Aoki, J. Drynan, "A Quarter-Micrometer Interconnection Technology Using a TiN/Al-Si-Cu/TiN/Al-Si-Cu/TiN/Ti Multilayer Structure", IEEE Transactions on Electron Devices, vol. 40, No.2, Feb. 1993, pp. 296-302.

Primary Examiner—Tom Thomas
Assistant Examiner—David B. Hardy
Attorney, Agent, or Firm—Kay Houston; W. James Brady, III; Richard L. Donaldson

[57] ABSTRACT

A diffusion barrier trilayer 42 is comprised of a bottom layer 44, a seed layer 46 and a top layer 48. The diffusion barrier trilayer 42 prevents reaction of metallization layer 26 with the top layer 48 upon heat treatment, resulting in improved sheet resistance and device speed.

15 Claims, 3 Drawing Sheets

DIFFUSION BARRIER TRILAYER FOR MINIMIZING REACTION BETWEEN METALLIZATION LAYERS OF INTEGRATED CIRCUITS

This is a continuation of application Ser. No. 08/474,286 filed Jun. 2, 1995, now abandoned, which is a division of application Ser. No. 08/412,473, filed Mar. 28, 1995, now abandoned.

FIELD OF THE INVENTION

This invention relates generally to the fabrication of semiconductor devices, and more specifically to metallization layers of integrated circuits.

BACKGROUND OF THE INVENTION

Semiconductors are widely used in integrated circuits for electronic applications, including radios, computers, televisions, and high definition televisions. Such integrated circuits typically use multiple transistors fabricated in single crystal silicon. Many integrated circuits now contain multiple levels of metallization for interconnections.

Aluminum-copper (AlCu) alloys are typically used in VLSI (very large scale integration) metallization. To enhance the speed of devices, a low and stable sheet resistance is required for AlCu. However, AlCu can react with other metals (e.g. W) thereby increasing its sheet resistance. Sheet resistance is a measurement of a conductive material with a magnitude proportional to resistivity and inverse of thickness. TiN has been applied as a diffusion barrier between AlCu and the other metals to suppress their reactions. However, heat treatment of AlCu/TiN layered structures at 450° C. induces reactions between the AlCu and TiN, leading to an increase in the sheet resistance of the AlCu.

Several attempts have been made to improve the barrier properties of TiN in Al/TiN/Si, Al/TiN/silicide/Si and Al/TiN/W structures. In the past, the improvement of TiN barriers have mostly been achieved by optimizing the parameters during TiN deposition, such as introducing oxygen flow during deposition, changing the substrate temperature, or adding a substrate voltage bias. Other attempts have included post-deposition treatments such as thermal annealing and exposure to air.

SUMMARY OF THE INVENTION

The present invention is a method and structure for a diffusion barrier trilayer comprising a bottom layer deposited on a substrate, a seed layer deposited on the bottom layer, a top layer deposited on the seed layer, and a metallization layer deposited on the top layer. Reaction of the metallization layer with the top layer, which may occur upon heat treatment, is minimized due to the improved properties of the top layer of the diffusion barrier trilayer. This results in no degradation of sheet resistance of the metallization layer upon heat treatment, and no loss of integrated circuit device speed.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1:
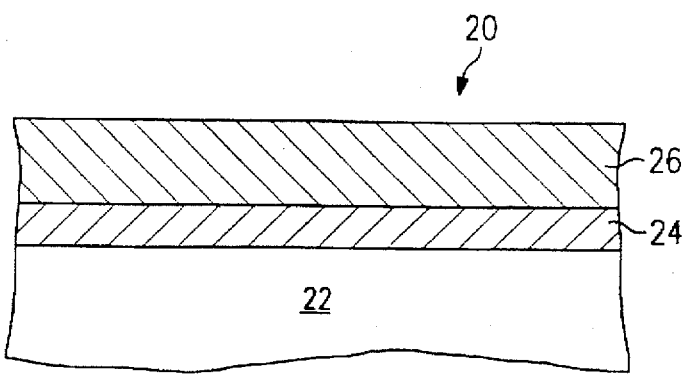
FIG. 1 is a prior art drawing of a cross-sectional view of a semiconductor wafer having a TiN diffusion barrier between the metallization layer and the substrate.

It has been found that the methods used in the past to improve the barrier properties of TiN are inadequate. Changing deposition temperature may induce change in other properties of TiN, such as stress and grain size, making it difficult to optimize these parameters at the same time. Adding substrate bias induces ion bombardment of the TiN layer, which may result radiation damage to existing devices. Post-deposition treatments involve additional processing steps, increasing process cycle time. Moreover, thermal annealing (densification) of TiN is possible only at the contact level on the integrated circuitry where AlCu is not present. Dosing with oxygen during deposition is undesirable, since oxygen may contaminate the Ti sputtering target, form oxide particles and increase the sheet resistance of TiN. Exposure of TiN to air for 24 hours has not been found to improve the barrier properties of TiN.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of a preferred embodiment of the present invention, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 20 | | Semiconductor wafer | |
| 22 | $SiO_2$ | Substrate | Tungsten vias, other metal layers or other semiconductor elements, (e.g. transistors, diodes); compound semiconductors (e.g. GaAs, InP, Si/Ge, SiC) may be used in place of Si. |
| 24 | TiN | Diffusion barrier | 500Å |
| 26 | AlCu | Metallization layer | Aluminum alloy comprising 0.5–4% copper by weight. |
| 28 | Aluminum-titanium compound | Reacted portion of metallization layer 26 | Aluminum nitride; other compounds having a higher sheet resistance than the metallization layer 26. |
| 30 | $SiO_2$ | Dielectric layer | Other dielectric materials. |
| 32 | Ti | First via liner | Other conductors. |
| 34 | TiN | Second via liner | Other conductors. |
| 36 | W | Via plug | Other conductors; stud. |
| 38 | | Grain boundaries | |
| 40 | | Crystal plane directions | |
| 42 | TiN/Ti/TiN | Diffusion barrier trilayer | TiN/AlCu/TiN; Other metal layers with a top layer having a single-crystal-like structure. |
| 44 | 400Å of TiN | Bottom layer of diffusion barrier trilayer | 100–2000Å of TiN, other metals such as TiW, TiWN, TiAlN, TiSiN, Ta, TaN TaSiN or other crystalline or amorphous diffusion barriers. |
| 46 | 500Å of Ti | Seed layer of diffusion barrier trilayer | 200–1000Å of Ti; 100–6000Å of AlCu alloy with 0.5–4% by weight copper solutes; a material with a similar crystal structure to that of the top layer 48 of the diffusion barrier trilayer. |
| 48 | 100Å of TiN | Top layer of diffusion barrier trilayer | 100–2000Å of TiN, other metals such as TiW, TiWN or other crystalline diffusion barriers. |

The present invention is a diffusion barrier trilayer that minimizes the reaction of a metallization layer with underlying barrier layers of integrated circuits. The trilayer comprises a bottom layer similar to the single TiN layer used in the past, a seed layer comprising a material with a similar crystal structure as the top layer, and preferably with a single-crystal-like microstructure, and a top layer grown upon the seed layer, also having a single-crystalline-like microstructure. The top layer of the diffusion barrier trilayer is adjacent the metallization layer. Reaction between the top layer of the diffusion barrier trilayer and the metallization layer is eliminated or minimized, maintaining the sheet resistance of the metallization layer and enhancing the speed of the integrated circuit. As device size shrinks to quarter micron range, maintaining a low sheet resistance of metallization layers used to form conductors becomes increasingly important.

First, problems recognized herein with the prior art will be discussed with FIGS. 1–6 used for reference. FIG. 1 shows a cross-sectional view of a semiconductor wafer 20, with a diffusion barrier 24 deposited on a substrate 22. The substrate 22 may comprise $SiO_2$, but may also comprise tungsten vias, other metal layers or semiconductor elements. The diffusion barrier 24 of the past typically comprised a 500 Å layer of TiN. A metallization layer 26 was deposited over the diffusion barrier 24, where the metallization layer 26 usually comprised 6000 Å of AlCu, having a sheet resistance of approximately 50–60 mΩ/square.

In semiconductor manufacturing, heat treatments of subsequently deposited layers (not shown) are often required. For example, some dielectric layers are cured at 400°–450° C. Also, the final stage of some semiconductor manufacturing methods is a sintering step to repair the damage in transistors, in which the wafer is also heated to around 450° C. Reflow of aluminum conductive layers may be required for some integrated circuits. Heating the wafer 20 causes the atoms in the metallization layer 26 and diffusion barrier 24 to become more mobile, causing a reaction between the two. This chemical reaction creates a reacted portion 28 of the metallization layer 26, shown in FIG. 2. The reacted portion 28 is comprised of an aluminum-titanium and/or aluminum-nitrite compound having a high sheet resistance, which may extend into the metallization layer as much as 500–800 Å. The reacted portion 28 of the metallization layer 26 increases the sheet resistance (for example, up to 15%, or 70 mΩ/square) of the metallization layer 26, which has a deleterious effect on device speed, a critical feature of VLSI circuits.

Figure 2:
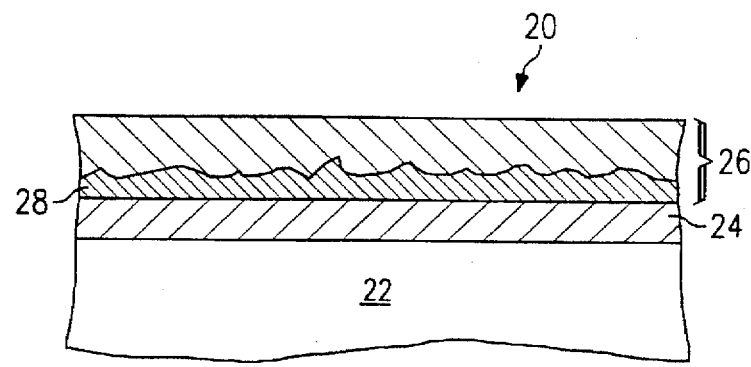
FIG. 2 is a prior art drawing showing the wafer of FIG. 1 after heat treatment, where the metallization layer has reacted with the diffusion barrier.
Figure 3:
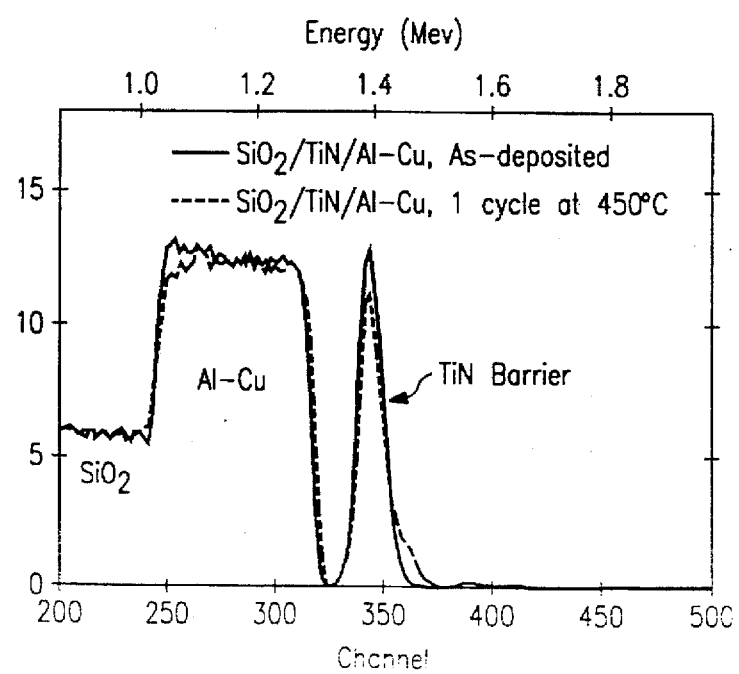
FIG. 3 is a Rutherford Backscattering Spectroscopy (RBS) of a prior art wafer before and after heat treatment.

FIG. 3 is a Rutherford Backscattering Spectroscopy (RBS) of the conventional AlCu/TiN layered structure shown in FIGS. 1 and 2 before and after heat treatments at 450° C. The tail of the Ti signals indicates reaction has occurred between AlCu and the underlying TiN.

Figure 4:
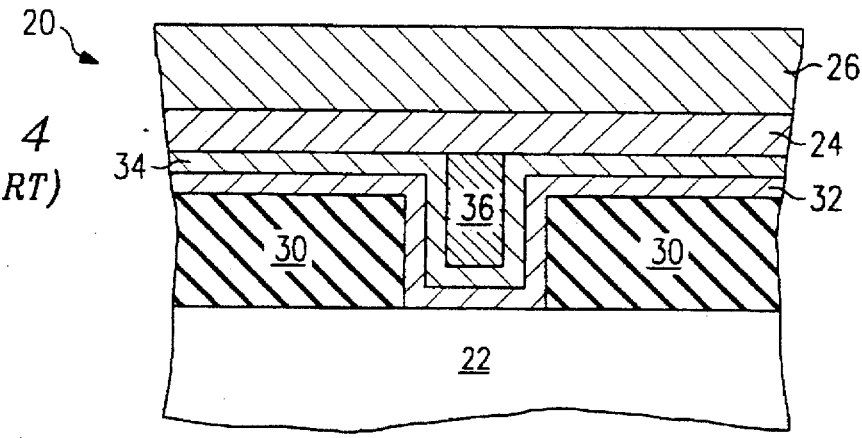
FIG. 4 is a prior art drawing showing a typical via plug structure used to connect a metallization layer to underlying circuitry or metal layers.

FIG. 4 shows another application of a diffusion barrier 24 found in prior art, where a dielectric layer 30 comprising, for example, $SiO_2$ has been deposited and etched so that electrical contact may be made to underlying substrate 22. A first via liner 32, typically comprised of titanium is deposited, and next a second via liner 34, comprised of TiN, for example, is deposited. The via plug 36 is usually formed from a metal such as tungsten, but may also comprise other metals or alloys. The diffusion barrier 24 of TiN is deposited next, followed by metallization layer 26, again comprised of AlCu.

Figure 5:
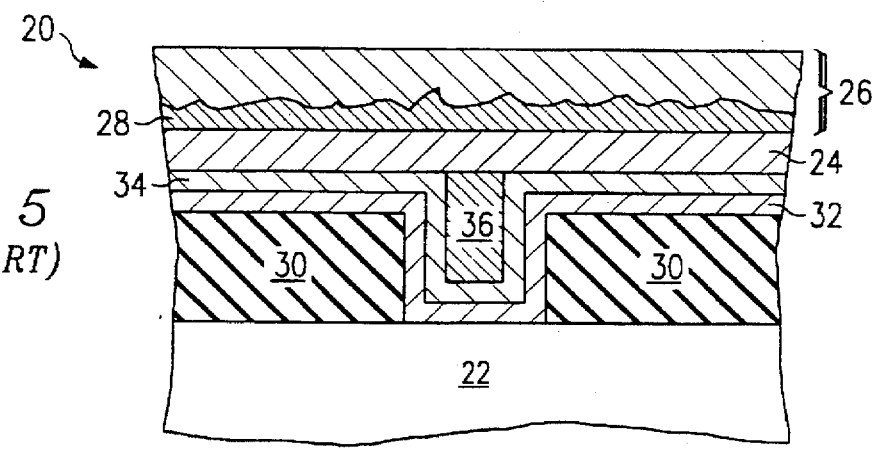
FIG. 5 shows the wafer of FIG. 4 after heat treatment, with a portion of the metallization layer reacted with the diffusion barrier.

As with the other prior art example, when the structure is exposed to heat, the metallization layer 26 reacts with the diffusion barrier 24 to leave a reacted portion 28 of the metallization layer 26 as shown in FIG. 5, increasing the sheet resistance of the metallization layer 26.

Figure 6:
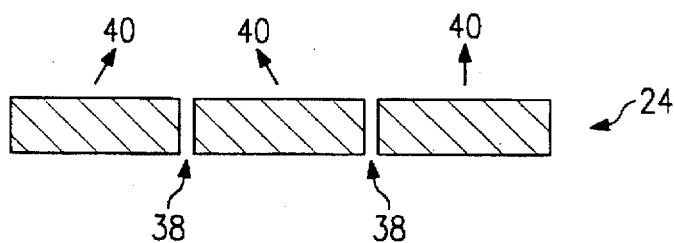
FIG. 6 demonstrates the crystal structure of the diffusion barrier of prior art, having a polycrystalline structure with high-angle grain boundaries.

A problem recognized herein with the prior art examples discussed is the microstructure of the diffusion barrier 24. TiN deposited on amorphous $SiO_2$ has a randomly oriented polycrystalline structure, as shown in FIG. 6. The crystal structure has many high-angle grain boundaries 38 where atoms can migrate easily when the structure is heated. The crystal plane directions 40 of each crystal are highly irregular and resemble those of a polycrystalline material where the directions of the crystal planes are not all aligned, e.g. parallel. Therefore, the crystal structure of the TiN allows atoms to easily migrate when a wafer is heated. The present invention solves this problem by forming a layer of TiN adjacent the metallization layer 26 having single-crystal-like qualities. The terms "single-crystal-like" and "textured" are defined as having a molecular crystalline structure similar to that of a single crystal, where the direction of the crystal planes are aligned substantially in the same direction.

Figure 7:
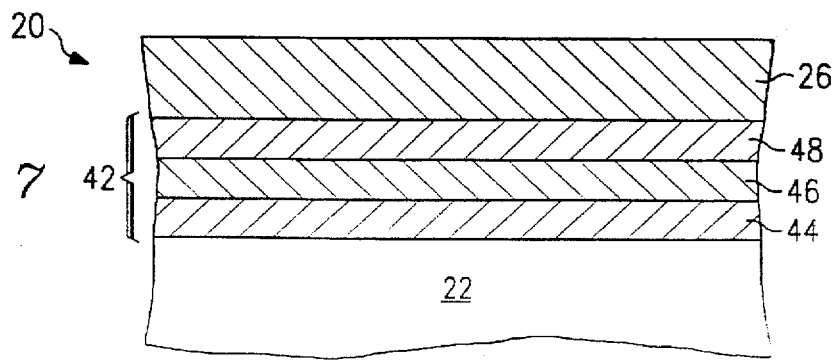
FIG. 7 is a cross-sectional view of the present invention, a diffusion barrier trilayer.

The present invention is shown in cross-section in FIG. 7. A diffusion barrier trilayer 42 is deposited on the substrate 22, upon which metallization layer 26 is deposited. The diffusion barrier trilayer 42 is comprised of a bottom layer 44, a seed layer 46 and a top layer 48. The layers 44, 46, 48 are typically deposited by sputtering but also may be deposited by chemical vapor deposition, or electron beam deposition, for example. The TiN of bottom layer 44 and top layer 48 is preferably sputtered on at approximately 400° C. The seed layer 46 is preferably 500 Å of Ti sputtered on at 300° C. The bottom layer 44 preferably comprises 100–6000 Å of TiN (more preferably 400 Å of TiN), and is used to isolate the seed layer 46, top layer 48 and metallization layer 26 from underlying metals (e.g. W via plugs or studs). The seed layer 46 may also be 100–6000 Å of AlCu comprising 0.5–4% by weight of copper, or other metals. The seed layer 46 acts as a seed, to alter the crystal structure and properties of the top layer 48. The seed layer 46 is also used as a sacrificial layer to isolate the bottom layer 44 from the top layer 48 so that very little interdiffusion occurs between these two TiN layers. The top layer 48 is preferably 100–1000 Å of TiN (more preferably, 100 Å of TiN), grown on top of the seed layer 46 in an epitaxial manner. The top layer 48 isolates the metallization layer 26 from the seed layer 46. Due to the improved properties of the crystalline structure of the top layer (caused by the existence of the seed layer 46), the TiN does not react significantly with the metallization layer 26 and the sheet resistance of the metallization layer 26 remains unchanged upon heat treatment. Moreover, the top layer 48 does not react with the seed layer 46.

Figure 8:
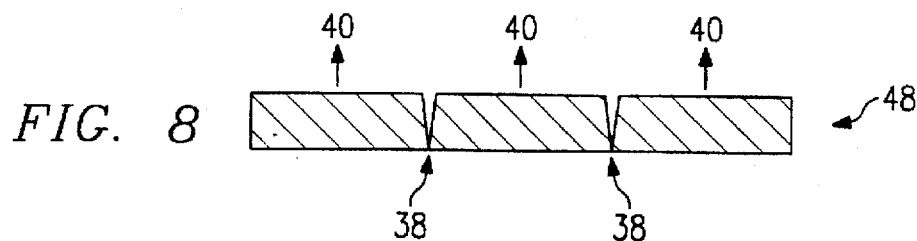
FIG. 8 demonstrates the crystal structure of the top layer of the diffusion barrier trilayer, having a single-crystal-like appearance.

In semiconductor technology, when silicon is grown, a seed is used to orient the crystal structure in the desired configuration. Similarly, the seed layer 46 of the trilayer 42 orients the crystal structure of the subsequently deposited top layer 48. The seed layer 46 of the diffusion barrier trilayer 42 is a material such as Ti or AlCu that is chosen for its crystal structure, lattice parameters and crystal alignment. A crystal structure and lattice parameters are desired that are similar to those of the top layer 48. As a result, the top layer 48 has a single-crystal-like structure, as shown in FIG. 8.

Figure 9:
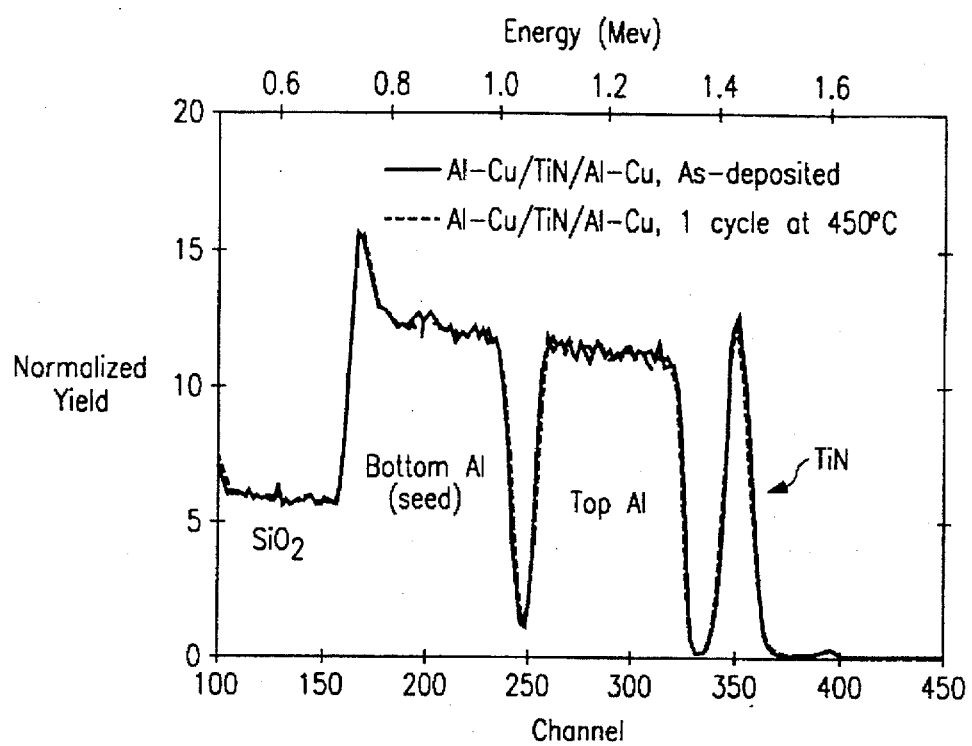
FIG. 9 is a Rutherford Backscattering Spectroscopy (RBS) of an experimental wafer having a diffusion barrier bilayer, before and after heat treatment.

Experiments have been performed to demonstrate the advantages of the present invention. FIG. 9 shows an RBS of a structure comprising a metallization layer 26 of AlCu, a top layer 48 of TiN, and a seed layer 46 of AlCu, subjected to the same heat treatment of 450° C. as described in FIG. 3. In contrast to FIG. 3, no reaction takes place between the AlCu and TiN. In the experiment, the seed layer 46 is comprised of AlCu and the bottom layer 44 is not used. The RBS results of the experiment were confirmed by cross-section transmission electron microscopy. X-ray diffraction show by using the seed layer 42, the top layer 48 of TiN becomes more strongly textured or more single-crystalline-like compared with polycrystalline TiN deposited on amorphous $SiO_2$. The (111) X-ray peak intensity of the TiN on $SiO_2$ is less than one tenth of that of the TiN on AlCu. The enhanced texture of the TiN top layer 48 on the AlCu seed layer 46 is due to the fact that the sputtered AlCu seed layer 46 has a strong (111) texture and the crystallographic structure and lattice parameters of TiN top layer 48 are similar to those of Al.

Figure 10:
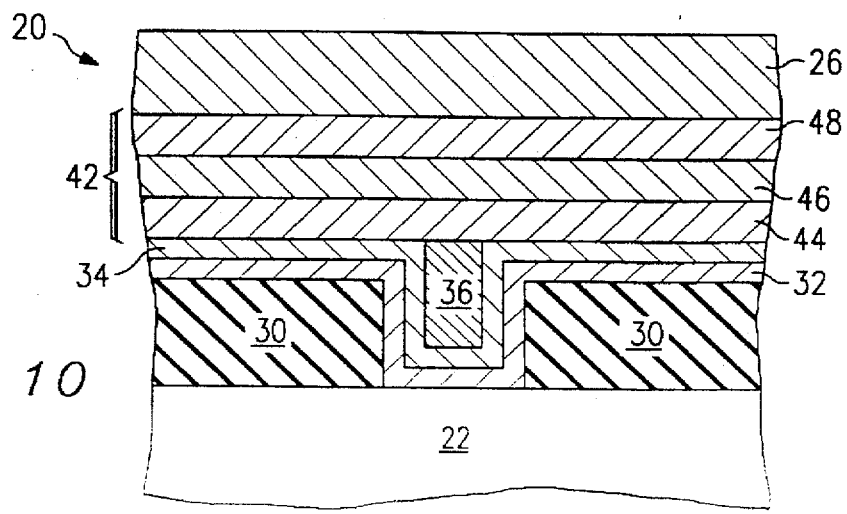
FIG. 10 shows the present invention implemented on the structure shown in FIG. 4.

Preferably, the top layer 48 is thinner than the bottom layer 44, which causes less reaction between the metallization layer 26 of AlCu. The use of the seed layer 46 allows the top layer 48 of TiN to be thin enough to minimize the reactions with the metallization layer 26, while the bottom layer 44 of TiN may be of sufficient thickness to provide electromigration resistance and suppression of possible interdiffusion between the metal stack (metallization layer 26/top layer 48/seed layer 46) and underlying metals, for example, the tungsten via plug 36 shown in FIG. 10. Because of the thinness and improved properties (due to the existence of the seed layer) of the top layer 48, the top layer 48 does not react significantly with the metallization layer 26 and the sheet resistance of the metallization layer remains unchanged upon heat treatment. Moreover, the top layer 48 does not react with the seed layer 46, either, which can be seen in the RBS of FIG. 9.

Alternates for processes and element materials are appropriate and will be obvious to those skilled in the art. For example, the top layer 48 may comprise other crystalline diffusion barrier materials such as TiW, TiWN, TiAlN, TiSiN, Ta or TaN. The bottom layer 44 may comprise other crystalline or amorphous diffusion barrier materials such as TiW, TiWN, TiAlN, TiSiN, Ta, TaN, or TaSiN. The substrate may be a dielectric (e.g. $SiO_2$, PETEOS, BPSG), a metal (e.g. W, Au) or a semiconductor (e.g. Si, GaAs). The seed layer 46 may comprise other materials having a crystal structure suitable for aligning the crystal structure of the top layer 48. The metallization layer 26 may comprise aluminum, copper, alloys thereof, or other metals. The diffusion barrier trilayer 42 may be configured as continuous films over the entire substrate 22, or patterned after deposition, possibly into features with submicron dimensions.

The present invention disclosed herein of a diffusion barrier trilayer offers an advantage over conventional diffusion barriers in that reaction of metallization layers upon heat treatment with the underlying diffusion barriers is minimized or eliminated, resulting in no increase in sheet resistance of the metallization layer, and thus no detrimental effect on device speed.

While the invention has been described with reference to illustrative embodiments, this description is not intended to be construed in a limiting sense. Various modifications and combinations of the illustrative embodiments, as well as other embodiments of the invention, will be apparent to persons skilled in the an upon reference to the description. It is therefore intended that the appended claims encompass any such modifications or embodiments.

What is claimed is:

1. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said bottom layer comprises TiN, said seed metal layer comprises Ti, and said top metal layer comprises TiN.

2. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said bottom layer comprises TiN, said seed metal layer comprises an aluminum-copper alloy, and said top metal layer comprises TiN.

3. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said top metal layer and said seed metal layer are single-crystal-like, and wherein said crystalline structure of said top metal layer is aligned to said crystalline structure of said seed metal layer, wherein said seed metal layer comprises aluminum.

4. The structure of claim 3 wherein said seed metal layer also comprises copper solutes in the composition range of 0.5 to 4 percent by weight.

5. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said top metal layer and said seed metal layer are single-crystal-like, and wherein said crystalline structure of said top metal layer is aligned to said crystalline structure of said seed metal layer, wherein said seed metal layer comprises copper.

6. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer:

wherein said crystalline structures of said top metal layer and said seed metal layer are single-crystal-like, and wherein said crystalline structure of said top metal layer is aligned to said crystalline structure of said seed metal layer, wherein said metallization layer comprises aluminum, and wherein said metallization layer also comprises copper solutes in the composition range of 0.5 to 4 percent by weight.

7. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said top metal layer and said seed metal layer are single-crystal-like, and wherein said crystalline structure of said top metal layer is aligned to said crystalline structure of said seed metal layer, wherein said top metal layer is a crystalline metal chosen from the group consisting of TiN, TiW, TiWN, TiAlN, TiSiN, Ta and TaN.

8. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said bottom layer has a greater thickness than said top metal layer.

9. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said seed metal layer comprises aluminum.

10. The structure of claim 9 wherein said seed metal layer also comprises copper solutes in the composition range of 0.5 to 4 percent by weight.

11. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said seed metal layer comprises copper.

12. A diffusion barrier trilayer for semiconductor wafers, comprising:

a bottom metal layer;

a seed metal layer adjacent said bottom layer and having a crystalline structure; and a top metal layer adjacent said seed metal layer and having a crystalline structure;

wherein said crystalline structures of said top metal layer and said seed metal layer are single-crystal-like, and wherein said crystalline structure of said top metal layer is aligned to said crystalline structure of said seed metal layer, wherein said top metal layer is a crystalline metal chosen from the group consisting of TiN, TiW, TiWN, TiAlN, TiSiN, Ta and TaN.

13. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said top metal layer and said seed metal layer are single-crystal-like, and wherein said crystalline structure of said top metal layer is aligned to said crystalline structure of said seed metal layer, wherein said bottom layer has a greater thickness than said top metal layer.

14. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said too metal layer and said seed metal layer are single-crystal-like, and wherein said crystalline structure of said top metal layer is aligned to said crystalline structure of said seed metal layer, wherein said bottom layer comprises TiN, said seed metal layer comprises Ti, and said top metal layer comprises TiN.

15. A semiconductor wafer metallization structure, comprising:

a substrate;

a bottom layer adjacent said substrate;

a seed metal layer adjacent said bottom layer and having a crystalline structure;

a top metal layer adjacent said seed metal layer and having a crystalline structure; and a metallization layer adjacent said top metal layer;

wherein said crystalline structures of said top metal layer and said seed metal layer are single-crystal-like, and wherein said crystalline structure of said top metal layer is aligned to said crystalline structure of said seed metal layer, wherein said bottom layer comprises TiN, said seed metal layer comprises an aluminum-copper alloy, and said top metal layer comprises TiN.

* * * * *